(12) United States Patent
Hou

(10) Patent No.: US 12,154,636 B2
(45) Date of Patent: Nov. 26, 2024

(54) ANTI-FUSE STRUCTURE, ANTI-FUSE ARRAY AND MEMORY

(71) Applicant: CHANGXIN MEMORY TECHNOLOGIES, INC., Hefei (CN)

(72) Inventor: Chuangming Hou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 205 days.

(21) Appl. No.: 17/929,747

(22) Filed: Sep. 5, 2022

(65) Prior Publication Data

US 2023/0386589 A1 Nov. 30, 2023

Related U.S. Application Data

(63) Continuation of application No. PCT/CN2022/096906, filed on Jun. 2, 2022.

(30) Foreign Application Priority Data

May 25, 2022 (CN) .......................... 202210577084.X

(51) Int. Cl.
*G11C 17/16* (2006.01)
*G11C 17/18* (2006.01)
(Continued)

(52) U.S. Cl.
CPC .............. *G11C 17/16* (2013.01); *G11C 17/18* (2013.01); *H01L 23/5252* (2013.01); *H10B 20/20* (2023.02)

(58) Field of Classification Search
CPC ..................................................... G11C 17/16
(Continued)

(56) References Cited

U.S. PATENT DOCUMENTS 10,127,993 B2 * 11/2018 Chung .................. G11C 17/18
2011/0103127 A1 5/2011 Kurjanowicz
(Continued)

FOREIGN PATENT DOCUMENTS

| CN | 105609485 A | 5/2016 |
| EP | 2966685 B1 | 2/2020 |
| JP | 2015076556 A | 4/2015 |

OTHER PUBLICATIONS

Supplementary European Search Report in the European application No. 22760861.9, mailed on Oct. 26, 2023. 8 pages.
(Continued)

*Primary Examiner* — Muna A Techane
(74) *Attorney, Agent, or Firm* — Syncoda LLC; Feng Ma

(57) ABSTRACT

An anti-fuse structure includes: a first unit including a first selection transistor, a first anti-fuse (AF) cell and a second AF cell; and a second unit including a second selection transistor, a third AF cell and a fourth AF cell. The first unit and second unit share an active region, which is provided with a first extension part and a second extension part which are independent of each other at a first side, and provided with a third extension part and a fourth extension part which are independent of each other at a second side, the first side being opposite to the second side. The first AF cell is arranged at the first extension part, the second AF cell is arranged at the second extension part, the third AF cell is arranged at the third extension part, and the fourth AF cell is arranged at the fourth extension part.

17 Claims, 4 Drawing Sheets

(51) Int. Cl.
H01L 23/525 (2006.01)
H10B 20/20 (2023.01)
(58) Field of Classification Search
USPC .................................... 365/96, 257
See application file for complete search history.

(56) References Cited

U.S. PATENT DOCUMENTS

2015/0287730 A1* 10/2015 Wu .................. G11C 16/0433
　　　　　　　　　　　　　　　　　　　　　　　　365/96
2016/0078962 A1　　3/2016　Park
2016/0300843 A1　10/2016　Jung
2022/0102367 A1　　3/2022　Huang
2022/0139491 A1* 　5/2022　Denorme ............... G11C 29/52
　　　　　　　　　　　　　　　　　　　　　　　　365/174
2023/0092101 A1　　3/2023　Chi

OTHER PUBLICATIONS

JP first office action in application No. 2022-552391, mailed on Jul. 23, 2024.

* cited by examiner

ANTI-FUSE STRUCTURE, ANTI-FUSE ARRAY AND MEMORY

CROSS-REFERENCE TO RELATED APPLICATIONS

This is a continuation of International Patent Application No. PCT/CN2022/096906 filed on Jun. 2, 2022, which claims priority to Chinese Patent Application No. 202210577084.X filed on May 25, 2022. The disclosures of the above-referenced applications are hereby incorporated by reference in their entirety.

BACKGROUND

In the semiconductor industry, fuse elements are widely used in integrated circuits due to multiple uses thereof. For example, a plurality of circuit modules with the same function are designed as backups in an integrated circuit, and when one of the circuit modules is found to have failure, the circuit module is disconnected from other functional circuits in the integrated circuit by blowing of a fuse element, and another circuit module with the same function is used to replace the failure circuit module.

With the continuous development of semiconductor technology, Anti-fuse technology has attracted the attention of many inventors and manufacturers. The anti-fuse element stores information by changing from an insulating state to a conductive state. Writing information to the anti-fuse element is executed by dielectric breakdown caused by application of high voltage. Before programming, an anti-fuse memory cell is capacitive, and no conduction channel is formed. When programming and breakdown occurs, a conduction channel is formed at both ends of the anti-fuse memory cell, which enables the current to pass. The magnitude of the conduction current is related to the programming effect.

For example, an anti-fuse structure usually includes an Anti-Fuse cell (AF cell) and a selection transistor (XADD). When writing, high voltage (about 5.5-6V) is applied to the AF cell, 0V is input at a corresponding Bit Line (BL) terminal, and the selection transistor is turned on, so that thin gate oxide of the AF cell is broken down under the high voltage and the resistance is significantly reduced, thus achieving the purpose of writing.

With the reduction of chip size, the area of an anti-fuse array must also be reduced to save valuable space for memory array. However, due to the design rule and manufacturability requirements of the anti-fuse structure, the area of the anti-fuse array cannot be reduced in the case of keeping the number of AF cells constant, which cannot meet the demand of chip miniaturization.

SUMMARY

The disclosure relates to the field of integrated circuits, and in particular to an anti-fuse structure, an anti-fuse array and a memory, which can reduce the area of the anti-fuse array in the case of keeping the number of AF cells constant.

The disclosure relates to an anti-fuse structure, which includes: a first circuit and a second circuit, the first circuit including a first selection transistor, a first AF cell and a second AF cell, the second circuit including a second selection transistor, a third AF cell and a fourth AF cell. The first circuit and the second circuit share an active region. the active region is provided with a first extension part and a second extension part which are independent of each other at a first side, and the active region is provided with a third extension part and a fourth extension part which are independent of each other at a second side, the first side being opposite to the second side. The first AF cell is arranged at the first extension part, the second AF cell is arranged at the second extension part, the third AF cell is arranged at the third extension part, and the fourth AF cell is arranged at the fourth extension part.

In one embodiment, the anti-fuse structure further includes: a first gate structure, a second gate structure, a third gate structure, a fourth gate structure, a fifth gate structure, a sixth gate structure, a first doped region, a second doped region, a third doped region. The first gate structure is, the second gate structure is arranged on the surface of the active region and spaced from the first gate structure, the third gate structure is arranged on the surface of the first extension part; the fourth gate structure is arranged on the surface of the second extension part, the fifth gate structure is arranged on the surface of the third extension part, the sixth gate structure is arranged on the surface of the fourth extension part, the first doped region is arranged in the active region between the first gate structure and the second gate structure, the second doped region is arranged in the active region on the side, away from the second gate structure, of the first gate structure and in the first extension part and the second extension part, and the third doped region is arranged in the active region on the side, away from the first gate structure, of the second gate structure and in the third extension part and the fourth extension part. The first gate structure, the first doped region and the second doped region form the first selection transistor; the third gate structure and the second doped region in the first extension part form the first AF cell; the fourth gate structure and the second doped region in the second extension part form the second AF cell; the second gate structure, the first doped region and the third doped region form the second selection transistor; the fifth gate structure and the third doped region in the third extension part form the third AF cell, and the sixth gate structure and the third doped region in the fourth extension part form the fourth AF cell.

In one embodiment, the first side and the second side are opposite in a first direction, and the first gate structure and the second gate structure are arranged in the first direction.

In one embodiment, the third gate structure and the fourth gate structure are arranged in a second direction, the second direction being perpendicular to or having an acute angle with the first direction.

In one embodiment, the fifth gate structure and the sixth gate structure are arranged in the second direction, the second direction being perpendicular to or having an acute angle with the first direction.

In one embodiment, the anti-fuse structure further includes a bit line connection structure BLC, which is connected to the first doped region between the first gate structure and the second gate structure, and the first doped region can be connected to a BL through the bit line connection structure BLC.

In one embodiment, the anti-fuse structure further includes a first connection structure and a second connection structure. The first connection structure is connected to the third gate structure, the third gate structure can be connected to a programming line through the first connection structure, and the first connection structure is arranged on the side, away from the second extension part, of the first extension part. The second connection structure is connected to the fourth gate structure, the fourth gate structure can be connected to another programming line through the second connection structure, and the second connection structure is arranged on the side, away from the first extension part, of the second extension part.

In one embodiment, the third gate structure includes a third main region corresponding to the first extension part and a third sub-region protruding in a direction away from the second extension part, and the first connection structure is connected to the third sub-region. The fourth gate structure includes a fourth main region corresponding to the second extension part and a fourth sub-region protruding in a direction away from the first extension part, and the second connection structure is connected to the fourth sub-region.

In one embodiment, the anti-fuse structure further includes a third connection structure and a fourth connection structure. The third connection structure is connected to the fifth gate structure, the fifth gate structure can be connected to a programming line through the third connection structure, and the third connection structure is arranged on the side, away from the fourth extension part, of the third extension part. The fourth connection structure is connected to the sixth gate structure, the sixth gate structure can be connected to another programming line through the fourth connection structure, and the fourth connection structure is arranged on the side, away from the third extension part, of the fourth extension part.

In one embodiment, the fifth gate structure includes a fifth main region corresponding to the third extension part and a fifth sub-region protruding in a direction away from the fourth extension part, the third connection structure is connected to the fifth sub-region. The sixth gate structure includes a sixth main region corresponding to the fourth extension part and a sixth sub-region protruding in a direction away from the third extension part, and the fourth connection structure is connected to the sixth sub-region.

In one embodiment, the first selection transistor and the second selection transistor are symmetrically arranged with a first axis as a symmetry axis, the first AF cell and the third AF cell are symmetrically arranged with the first axis as the symmetry axis, and the second AF cell and the fourth AF cell are symmetrically arranged with the first axis as the symmetry axis.

Based on the embodiments of the disclosure, an anti-fuse array is further provided, which includes a plurality of anti-fuse structures as described above. The plurality of anti-fuse structures are arranged in a first direction and a second direction, and the first direction is perpendicular to the second direction or has an acute angle with the same.

In one embodiment, in the second direction, adjacent AF cells of adjacent anti-fuse structures share the same gate structure.

In one embodiment, the first selection transistors of the anti-fuse structures arranged in the second direction share the same gate structure, and the second selection transistors thereof share the same gate structure.

Based on the embodiments of the disclosure, a memory is further provided, which includes an anti-fuse array as described above.

In one embodiment, the memory further includes a plurality of programming lines arranged in the first direction and extending in the second direction. A row of anti-fuse structures arranged in the second direction corresponds to four programming lines, and the four programming lines are respectively connected to the first AF cells, the second AF cells, the third AF cells and the fourth AF cells of the anti-fuse structures.

In one embodiment, the memory further includes a plurality of BLs arranged in the second direction and extending in the first direction, and a column of anti-fuse structures arranged in the first direction shares the same BL.

In the anti-fuse structure provided by the embodiments of the disclosure, the first circuit and the second circuit share the same active region, which can eliminate the interval between the active regions caused by different active regions of the first circuit and the second circuit, and reduce the area of the anti-fuse structure. At the same time, each circuit contains two AF cells, which are respectively arranged at independent extension parts, so that the number of AF cells can be doubled under the same area. That is, when the design number of the AF cells is the same, the anti-fuse structure of the disclosure only needs to occupy about half of the area, thus meeting the miniaturization requirement.

DETAILED DESCRIPTION

The specific implementation mode of the anti-fuse structure, anti-fuse array and memory provided in the disclosure will be elaborated with reference to the accompanying drawings.

Figure 1A:
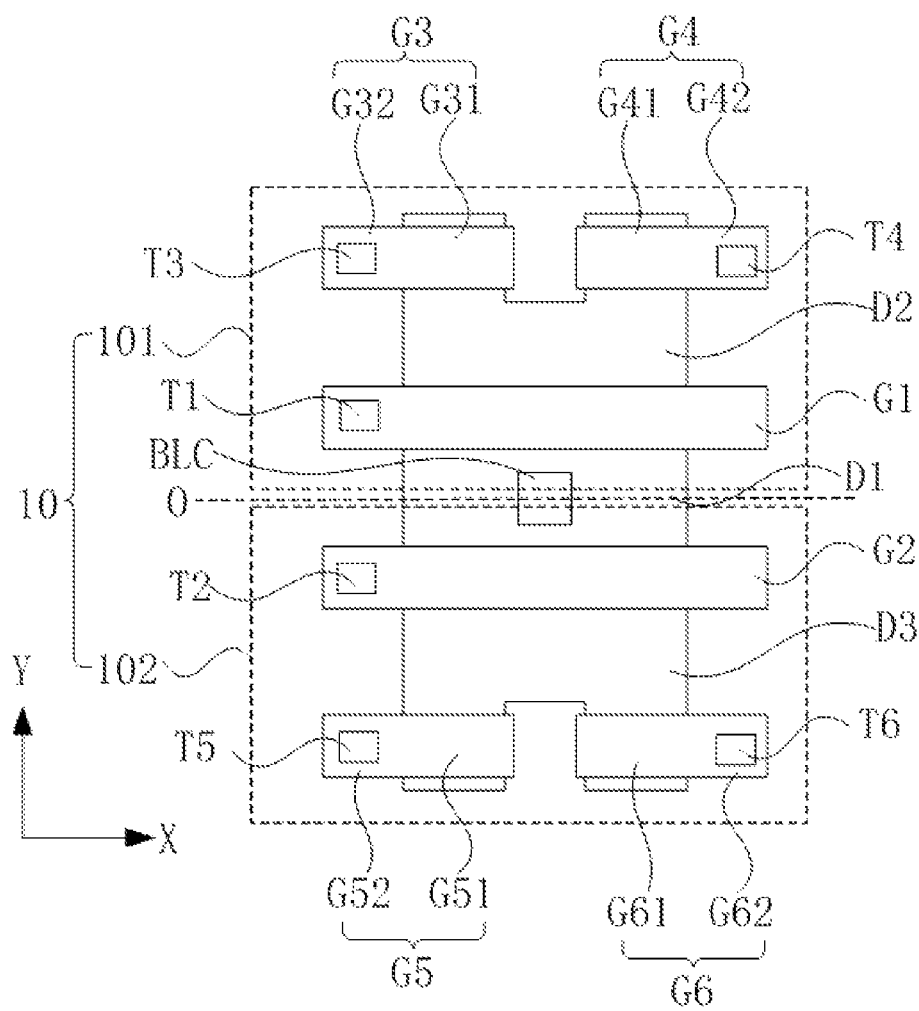
FIG. 1A is a schematic diagram of an anti-fuse structure according to some embodiments of the disclosure.
Figure 1B:
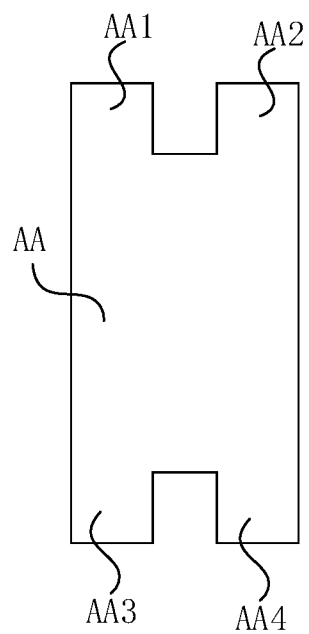
FIG. 1B is a schematic diagram of an active region according to some embodiments of the disclosure.

FIG. 1A is a schematic diagram of an anti-fuse structure according to some embodiments of the disclosure. FIG. 1B is a schematic diagram of an active region according to some embodiments of the disclosure. Referring to FIGS. 1A and 1B, the anti-fuse structure 10 includes a first unit 101 and a second unit 102.

The first unit 101 includes a first selection transistor, a first AF cell and a second AF cell, and the second unit 102 includes a second selection transistor, a third AF cell and a fourth AF cell.

The first unit 101 and the second unit 102 share an active region AA. The active region AA is provided with a first extension part AA1 and a second extension part AA2 which are independent of each other at a first side, and the active region AA is provided with a third extension part AA3 and a fourth extension part AA4 which are independent of each other at a second side, the first side being opposite to the second side. The first AF cell is arranged at the first extension part AA1, the second AF cell is arranged at the second extension part AA2, the third AF cell is arranged at the third extension part AA3, and the fourth AF cell is arranged at the fourth extension part AA4.

In the anti-fuse structure provided by the embodiments of the disclosure, the first unit 101 and the second unit 102 share the same active region AA, which can eliminate the interval between active regions AA caused by different active regions AA of the first unit 101 and the second unit 102, and thus reduce the area of the anti-fuse structure. At the same time, each unit contains two AF cells, which are respectively arranged at independent extension parts, so that the number of AF cells may be doubled under the same area. That is, when the design number of the AF cells is the same, the anti-fuse structure of the disclosure only needs to occupy about half of the area, thus meeting the miniaturization requirement.

Continuing to refer to FIGS. 1A and 1B, the structures of the first selection transistor, the first AF cell, the second AF cell, the second selection transistor, the third AF cell and the fourth AF cell are described in detail below.

The active region AA is provided with the first extension part AA1 and the second extension AA2 which are independent of each other at the first side, and the active region AA is provided with the third extension part AA3 and the fourth extension part AA4 which are independent of each other at the second side. The first side and the second side are opposite in a first direction (e.g., Y direction in the figure). For example, in the embodiment, the first side is the upper end of the active region AA, and the second side is the lower end of the active region AA.

The anti-fuse structure includes a first gate structure G1. The first gate structure G1 is arranged on the surface of the active region AA. In some embodiments, the first gate structure G1 extends in a second direction. In the embodiments, the second direction is the horizontal direction, i.e., X direction.

In some embodiments, the anti-fuse structure further includes a first word line connection structure T1, and the first gate structure G1 is electrically connected to a peripheral control circuit through the first word line connection structure T1. That is, the first word line connection structure T1 serves as a conductive plug to implement the electrical connection between the first gate structure G1 and the peripheral control circuit.

The anti-fuse structure further includes a second gate structure G2. The second gate structure G2 is arranged on the surface of the active region AA and spaced from the first gate structure G1. In some embodiments, the first gate structure G1 and the second gate structure G2 are connected to different word lines, so as to implement independent control of the first unit 101 and the second unit 102.

In the embodiment, both the first gate structure G1 and the second gate structure G2 extend in the second direction, the second gate structure G2 is spaced from the first gate structure G1 in the first direction, and the first direction is perpendicular to the second direction or has an acute angle with the second direction. Specifically, in the embodiment, the first direction is perpendicular to the second direction. For example, the second direction is the horizontal direction-X direction, and the first direction is the vertical direction-Y direction. In other embodiments, the first direction has an acute angle with the second direction. For example, the second direction is the horizontal direction-X direction, and the first direction is a direction having an acute angle with the horizontal direction.

In some embodiments, the anti-fuse structure further includes a second word line connection structure T2, and the second gate structure G2 is electrically connected to the peripheral control circuit through the second word line connection structure T2. That is, the second word line connection structure T2 serves as a conductive plug to implement the electrical connection between the second gate structure G2 and the peripheral control circuit.

The anti-fuse structure further includes a third gate structure G3, and the third gate structure G3 is arranged on the surface of the first extension part AA1 and can be connected to a programming line. In some embodiments, the third gate structure G3 extends in the second direction. That is, the extension direction of the third gate structure G3 is consistent with the extension direction of the first gate structure G1. In the first direction, the third gate structure G3 is spaced from the first gate structure G1, and the third gate structure G3 is arranged on a side, away from the second gate structure G2, of the first gate structure G1. The third gate structure G3 is only arranged on the surface of the first extension part AA1, but not on the surface of the second extension part AA2.

In the embodiment, the anti-fuse structure further includes a first connection structure T3. The first connection structure T3 is connected to the third gate structure G3, and the third gate structure G3 can be connected to a programming line located on the upper layer thereof through the first connection structure T3. That is, the first connection structure T3 serves as a conductive plug to implement the electrical connection of the third gate structure G3 with the upper programming line thereof.

In the embodiment, the first connection structure T3 is arranged on a side, away from the second extension part AA2, of the first extension part AA1. Specifically, the third gate structure G3 includes a third main region G31 corresponding to the first extension part AA1 and a third sub-region G32 protruding in a direction away from the second extension part AA2. That is, the third main region G31 faces the first extension part AA1, the third sub-region G32 is staggered with the first extension part AA1, and the first connection structure T3 is connected to the third sub-region G32 away from the second extension part AA2.

The anti-fuse structure further includes a fourth gate structure G4. The fourth gate structure G4 is arranged on the surface of the second extension part AA2, and can be connected to a programming line. In some embodiments, the fourth gate structure G4 extends in the second direction. That is, the extension direction of the fourth gate structure G4 is consistent with the extension direction of the first gate structure G1. In the first direction, the fourth gate structure G4 is spaced from the first gate structure G1, and the fourth gate structure G4 is arranged on a side, away from the second gate structure G2, of the first gate structure G1. In the second direction, the fourth gate structure G4 is spaced from the third gate structure G3, and the fourth gate structure G4 is only arranged on the surface of the second extension part AA2, but not on the surface of the first extension part AA1. It is to be understood that, in some embodiments, the lengths of the third gate structure G3 and the fourth gate structure G4 in the second direction are both smaller than the length of the first gate structure G1 in the second direction.

In the embodiment, the anti-fuse structure further includes a second connection structure T4. The second connection structure T4 is connected to the fourth gate structure G4, and the fourth gate structure G4 can be connected to a programming line located on the upper layer thereof through the second connection structure T4. That is, the second connection structure T4 serves as a conductive plug to implement the electrical connection of the fourth gate structure G4 with the upper programming line thereof. In some embodiments, the third gate structure G3 and the fourth gate structure G4 are connected to different programming lines, so as to implement independent control of the first AF cell and the second AF cell.

In the embodiment, the second connection structure T4 is arranged on a side, away from the first extension part AA1, of the second extension part AA2. Specifically, the fourth gate structure G4 includes a fourth main region G41 corresponding to the second extension part AA2 and a fourth sub-region G42 protruding in a direction away from the first extension part AA1. That is, the fourth main region G41 faces the second extension part AA2, the fourth sub-region G42 is staggered with the second extension part AA2, and the second connection structure T4 is connected to the fourth extension sub-region G42 away from the first extension part AA1.

The anti-fuse structure further includes a fifth gate structure G5. The fifth gate structure G5 is arranged on the surface of the third extension part AA3 and can be connected to a programming line. In some embodiments, the fifth gate structure G5 extends in the second direction. That is, the extension direction of the fifth gate structure G5 is consistent with the extension direction of the second gate structure G2. In the first direction, the fifth gate structure G5 is spaced from the second gate structure G2, and the fifth gate structure G5 is arranged on a side, away from the first gate structure G1, of the second gate structure G2. The fifth gate structure G5 is only arranged on the surface of the third extension part AA3, but not on the surface of the fourth extension part AA4.

In the embodiment, the anti-fuse structure further includes a third connection structure T5. The third connection structure T5 is connected to the fifth gate structure G5, and the fifth gate structure G5 can be connected to a programming line located on the upper layer thereof through the third connection structure T5. That is, the third connection structure T5 serves as a conductive plug to implement the first electrical connection of the fifth gate structure G5 with the upper programming line thereof.

In the embodiment, the third connection structure T5 is arranged on a side, away from the fourth extension part AA4, of the third extension part AA3. Specifically, the fifth gate structure G5 includes a fifth main region G51 corresponding to the third extension part AA3 and a fifth sub-region G52 protruding in a direction away from the fourth extension part AA4. That is, the fifth main region GM faces the third extension part AA3, the fifth sub-region G52 is staggered with the third extension part AA3, and the third connection structure T5 is connected to the fifth sub-region G52 away from the third extension part AA3.

The anti-fuse structure further includes a sixth gate structure G6. The sixth gate structure G6 is arranged on the surface of the fourth extension part AA4 and can be connected to a programming line. In some embodiments, the sixth gate structure G6 extends in the second direction. That is, the extension direction of the sixth gate structure G6 is consistent with the extension direction of the second gate structure G2. In the first direction, the sixth gate structure G6 is spaced from the second gate structure G2, and the sixth gate structure G6 is arranged on a side, away from the first gate structure G1, of the second gate structure G2. In the second direction, the sixth gate structure G6 is spaced from the fifth gate structure G5, and the sixth gate structure G6 is only arranged on the surface of the fourth extension part AA4, but not on the surface of the third extension part AA3. It is to be understood that, in some embodiments, the lengths of the fifth gate structure G5 and the sixth gate structure G6 in the second direction are both smaller than the length of the second gate structure G2 in the second direction.

In the embodiment, the anti-fuse structure further includes a fourth connection structure T6. The fourth connection structure T6 is connected to the sixth gate structure G6, and the sixth gate structure G6 can be connected to another programming line located on the upper layer thereof through the fourth connection structure T6. That is, the fourth connection structure T6 serves as a conductive plug to implement the electrical connection of the sixth gate structure G6 with the upper programming line thereof. In some embodiments, the fifth gate structure G5 and the sixth gate structure G6 are connected to different programming lines, so as to implement independent control of the third AF cell and the fourth AF cell.

In the embodiment, the fourth connection structure T6 is arranged on a side, away from the third extension part AA3, of the fourth extension part AA4. Specifically, the sixth gate structure G6 includes a sixth main region G61 corresponding to the fourth extension part AA4 and a sixth sub-region G62 protruding in a direction away from the third extension part AA3. That is, the sixth main region G61 faces the fourth extension part AA4, the sixth sub-region G62 is staggered with the fourth extension part AA4, and the fourth connection structure T6 is connected to the sixth sub-region G62.

The anti-fuse structure further includes a first doped region D1. The first doped region D1 is arranged in the active region AA between the first gate structure G1 and the second gate structure G2. In the embodiment, the active region AA is a P-type well region, and the first doped region D1 is an N-type doped region. In other embodiments, if the active region AA is an N-type well region, the first doped region D1 is a P-type doped region.

The anti-fuse structure further includes a bit line connection structure BLC. The bit line connection structure BLC is connected to the first doped region D1 between the first gate structure G1 and the second gate structure, and the first doped region D1 can be connected to a bit line through the bit line connection structure BLC. That is, the bit line connection structure BLC serves as a conductive plug for connecting the first doped region D1 to the bit line, so as to implement the electrical connection between the bit line and the first doped region D1.

The anti-fuse structure further includes a second doped region D2. The second doped region D2 is arranged in the active region AA on a side, away from the second gate structure, of the first gate structure G1 and in the first extension part AA1 and the second extension part AA2. In the embodiment, the doping type of the second doped region D2 is the same as the doping type of the first doped region D1, and is opposite to the doping type of the active region AA. If the active region AA is a P-type well region, the second doped region D2 is an N-type doped region. In other embodiments, if the active region AA is an N-type well region, the second doped region D2 is a P-type doped region.

The anti-fuse structure further includes a third doped region D3. The third doped region D3 is arranged in the active region AA on a side, away from the first gate structure G1, of the second gate structure G2 and in the third extension part AA3 and the fourth extension part AA4. In the embodiment, the doping type of the third doped region D3 is the same as the doping type of the first doped region D1, and is opposite to the doping type of the active region AA. If the active region AA is a P-type well region, the third doped region D3 is an N-type doped region. In other embodiments, if the active region AA is an N-type well region, the third doped region D3 is a P-type doped region.

The first gate structure G1 and the active region AA therebelow as well as the first doped region D1 and the second doped region D2 form a first selection transistor. The second doped region D2 is located in the first extension part AA1, and then the third gate structure G3 and the second doped region D2 located therebelow form a first AF cell. The second doped region D2 may also be located in the second extension part AA2, and then the fourth gate structure G4 and the second doped region D2 therebelow form a second AF cell.

In the embodiment, the third main region G31 of the third gate structure G3 serves as an effective region and forms the first AF cell with the second doped region D2, and the fourth main region G41 of the fourth gate structure G4 serves as an effective area and forms the second AF cell with the second doped region D2.

The second gate structure G2 and the active region AA therebelow as well as the first doped region D1 and the third doped region D3 form a second selection transistor. The third doped region D3 is located in the third extension part AA3, and then the fifth gate structure G5 and the third doped region D3 therebelow form a third AF cell. The third doped region D3 may also be located in the fourth extension part AA4, and then the sixth gate structure G6 and the third doped region D3 therebelow form a fourth AF cell.

In the embodiment, the fifth main region G51 of the fifth gate structure G5 serves as an effective region and forms the third AF cell with the third doped region D3, and the sixth main region G61 of the sixth gate structure G6 serves as an effective region and forms the third AF cell with the third doped region D3.

In the embodiment, the first selection transistor and the second selection transistor are symmetrically arranged with a first axis O as a symmetry axis, the first AF cell and the third AF cell are symmetrically arranged with the first axis O as the symmetry axis, and the second AF cell and the fourth AF cell are symmetrically arranged with the first axis O as the symmetry axis, which facilitates simplifying the layout design of the anti-fuse structure and improves the utilization rate.

It is to be understood that in the embodiments of the present application, the first gate structure G1, the second gate structure G2, the third gate structure G3, the fourth gate structure G4, the fifth gate structure G5 and the sixth gate structure G6 each includes a gate electrode (unshown in the figure) and a gate dielectric layer (unshown in the figure) between the gate electrode and the active region AA, so as to implement the basic functions of the gate structure. Herein, the material of the gate electrode may be polysilicon, and the material of the gate dielectric layer may be silicon oxide, high-K dielectric material, etc.

In the anti-fuse structure provided by some embodiments of the disclosure, the first unit 101 and the second unit 102 share the same active region AA, which can eliminate the interval between the active regions AA caused by different active regions AA of the first unit 101 and the second unit 102, and reduce the area of the anti-fuse structure. At the same time, each unit contains two AF cells, which are respectively arranged at independent extension parts, so that the number of AF cells may be doubled under the same area. That is, when the design number of the AF cells is the same, the anti-fuse structure of the disclosure only needs to occupy about half of the area, thus meeting the miniaturization requirement.

Figure 2:
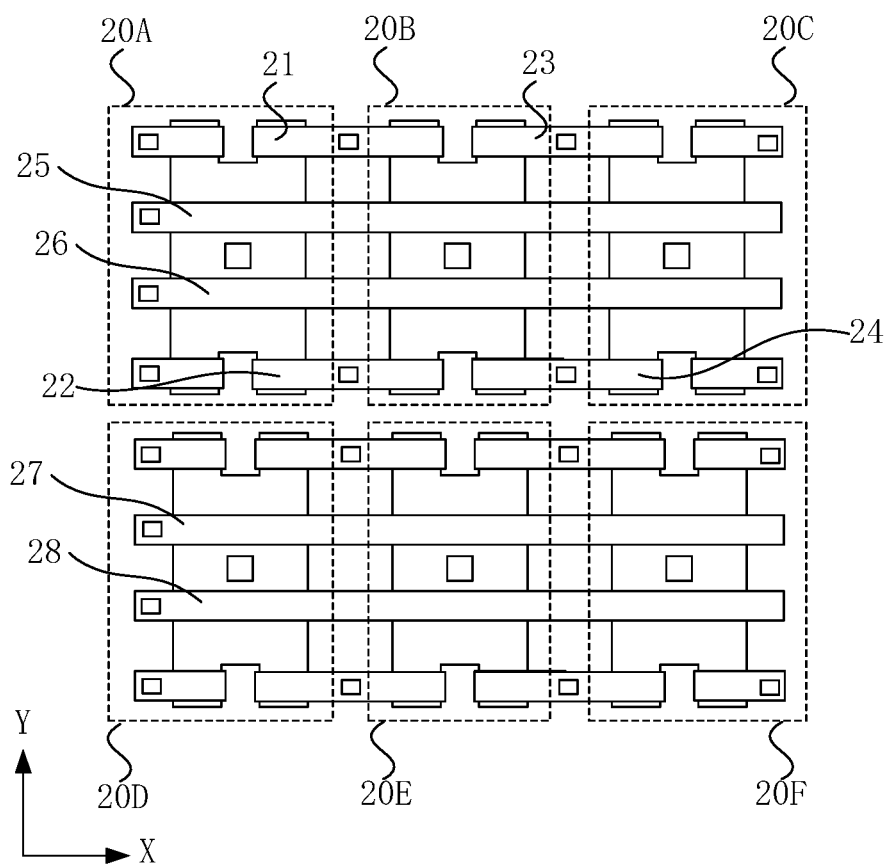
FIG. 2 is a schematic diagram of an anti-fuse array according to some embodiments of the disclosure.

Some embodiments of the disclosure also provide an anti-fuse array. Referring to FIG. 2, FIG. 2 is a schematic diagram of an anti-fuse array, and the anti-fuse array includes a plurality of anti-fuse structures as described above. The plurality of anti-fuse structures are arranged in a first direction and a second direction, and the first direction is perpendicular to the second direction or has an acute angle with the second direction. In the embodiments, the first direction is the vertical direction-Y direction, and the second direction is the horizontal direction-X direction. FIG. 2 schematically shows six anti-fuse structures, which are anti-fuse structures 20A, 20B, 20C, 20D, 20E and 20F, respectively. Herein, three anti-fuse structures as a group are arranged in the second direction to form a row, and AF cells of different rows are arranged in the first direction to form a column. For example, the anti-fuse structures 20A, 20B and 20C are arranged in the second direction to form a first row. The anti-fuse structures 20D, 20E and 20F are arranged in the second direction to form a second row. The anti-fuse structures 20A and 20D are arranged in the first direction to form a first column. The anti-fuse structures 20B and 20E are arranged in the first direction to form a second column. The anti-fuse structures 20C and 20F are arranged in the first direction to form a third column.

In the anti-fuse array provided by the embodiments of the disclosure, the first unit 101 (referring to FIG. 1A) and the second unit 102 (referring to FIG. 1A) of the anti-fuse structure share the same active region AA (referring to FIGS. 1A and 1B), which can eliminate the interval between active regions AA caused by adoption of different active regions AA by the first unit 101 and the second unit 102, and thus reduce the area of the anti-fuse structure. At the same time, each unit contains two AF cells, which are respectively arranged at independent extension parts, so that the number of AF cells may be doubled under the same area. That is, when the design number of the AF cells is the same, the anti-fuse structure of the disclosure only needs to occupy about half of the area, thus meeting the miniaturization requirement.

In the embodiments, in the second direction (that is, the horizontal direction-X direction), the adjacent AF cells of adjacent anti-fuse structures share the same gate structure (at least sharing the gate electrode of the same gate structure), which eliminates the interval existed due to adoption of two gate structures, reduces the distance between adjacent anti-fuse structures, and further reduces the space occupied by the anti-fuse array.

For example, referring to FIG. 2, in the second direction (that is, the horizontal direction-X direction), the anti-fuse structure 20A is adjacent to the anti-fuse structure 20B, the second AF cell of the anti-fuse structure 20A is adjacent to the first AF cell of the anti-fuse structure 20B, and the fourth AF cell of the anti-fuse structure 20A is adjacent to the third AF cell of the anti-fuse structure 20B. Then the second AF cell of the anti-fuse structure 20A and the first AF cell of the anti-fuse structure 20B share the same gate structure 21. That is, the gate structure 21 extends from the upper portion of the second extension part AA2 (referring to FIG. 1A) of the anti-fuse structure 20A to the upper portion of the first extension part AA1 (referring to FIG. 1A) of the anti-fuse structure 20B. The fourth AF cell of the anti-fuse structure 20A and the third AF cell of the anti-fuse structure 20B share the same gate structure 22. That is, the gate structure 22 extends from the upper portion of the fourth extension part AA4 (referring to FIG. 1A) of the anti-fuse structure 20A to the upper portion of the third extension part AA3 (referring to FIG. 1A) of the anti-fuse structure 20B.

For another example, referring to FIG. 2, in the second direction (that is, the horizontal direction-X direction), the anti-fuse structure 20B is adjacent to the anti-fuse structure 20C, the second AF cell of the anti-fuse structure 20B is adjacent to the first AF cell of the anti-fuse structure 20C, and the fourth AF cell of the anti-fuse structure 20B is adjacent to the third AF cell of the anti-fuse structure 20C. Then the second AF cell of the anti-fuse structure 20B and the first AF cell of the anti-fuse structure 20C share the same gate structure 23. That is, the gate structure 23 extends from the upper portion of the second extension part AA2 (referring to FIG. 1A) of the anti-fuse structure 20B to the upper portion of the first extension part AA1 (referring to FIG. 1A) of the anti-fuse structure 20C. The fourth AF cell of the anti-fuse structure 20B and the third AF cell of the anti-fuse structure 20C share the same gate structure 24. That is, the gate structure 24 extends from the upper portion of the fourth extension part AA4 (referring to FIG. 1A) of the anti-fuse structure 20B to the upper portion of the third extension part AA3 (referring to FIG. 1A) of the anti-fuse structure 20C.

In the embodiments, since the second AF cell of the anti-fuse structure 20A shares the same gate structure 21 with the first AF cell of the anti-fuse structure 20B, only one connection structure may be arranged to electrically connect the gate structure with a corresponding programming line, so that the number of connection structures is reduced. Similarly, only one connection structure may also be arranged to electrically connect the gate structure 22 with its corresponding programming line, electrically connect the gate structure 23 with its corresponding programming line, and electrically connect the gate structure 24 with its corresponding programming line.

In the embodiments, the first selection transistors of the anti-fuse structures arranged in the second direction share the same gate structure, and the second selection transistors share the same gate structure, which eliminates the interval existed due to adoption of two gate structures, reduces the distance between adjacent anti-fuse structures, and further reduces the space occupied by the anti-fuse array.

For example, referring to FIG. 2, the first selection transistors of the anti-fuse structures 20A, 20B and 20C in the first row share the same gate structure 25 (at least sharing the gate electrode of the same gate structure 25), and the second selection transistors thereof share the same gate structure 26 (at least sharing the gate electrode of the same gate structure 26). The first selection transistors of the anti-fuse structures 20D, 20E, 20F in the second row share the same gate structure 27 (at least sharing the gate electrode of the same gate structure 27), and the second selection transistors thereof share the same gate structure 28 (at least sharing the gate electrode of the same gate structure 28). It is to be understood that the gate electrodes in the gate structures 25, 26, 27, and 28 are word lines (that is, a part of the word lines are used as the gate electrodes of the selection transistors), and the word lines are controlled by a peripheral control circuit so as to turn on or off the first selection transistor and the second selection transistor.

In the embodiments, since the first selection transistors of the anti-fuse structures arranged in the second direction share the same gate structure, only one word line connection structure may be arranged to correspondingly connect the gate structure to the peripheral control circuit. Similarly, since the second selection transistors of the anti-fuse structures arranged in the second direction share the same gate structure, only one word line connection structure may also be arranged to correspondingly connect the gate structure to the peripheral control circuit.

Figure 3:
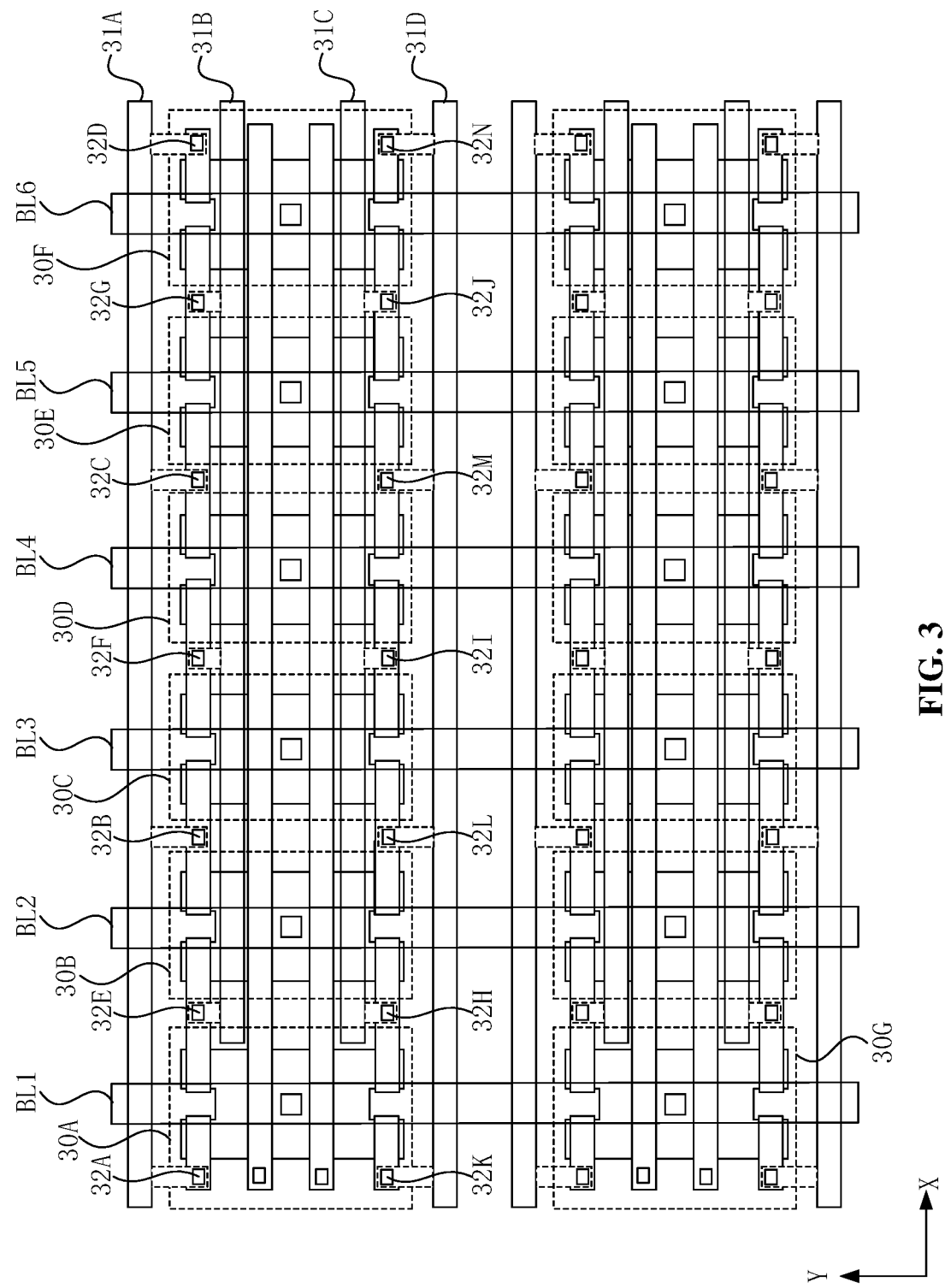
FIG. 3 is a schematic diagram of a memory according to some embodiments of the disclosure.

The embodiments of the disclosure further provide a memory, referring to FIG. 3. FIG. 3 is a structural schematic diagram of a memory according to some embodiments of the present disclosure. The memory includes an anti-fuse array as described above.

The memory further includes a plurality of programming lines arranged in the first direction (e.g., Y direction in the figure) and extending in the second direction (e.g., X direction in the figure) are further included. Herein, a row of anti-fuse structures arranged in the second direction corresponds to four programming lines, and the four programming lines are respectively connected to the first AF cells, the second AF cells, the third AF cells and the fourth AF cells of the anti-fuse structures. It is to be noted that the first AF cell, the second AF cell, the third AF cell, and the fourth AF cell of the same anti-fuse structure are respectively connected to different programming lines to implement respective control. In FIG. 3, in order to clearly show the structure of the memory provided by the embodiment of the disclosure, the programming lines are drawn by dotted lines. It is to be understood that the programming line and the anti-fuse structure may be located in different structural layers.

For example, a row of anti-fuse structures arranged in the second direction (e.g., X direction in the figure) includes anti-fuse structures 30A, 30B, 30C, 30D, 30E and 30F. This row of anti-fuse structures corresponds to four programming lines, which are programming line 31A, programming line 31B, programming line 31C and programming line 31D, respectively.

The programming line 31A is connected to the first AF cell of the anti-fuse structure 30A through a connection structure 32A, connected to the second AF cell of the anti-fuse structure 30B and the first AF cell of the anti-fuse structure 30C through a connection structure 32B, connected to the second AF cell of the anti-fuse structure 30D and the first AF cell of the anti-fuse structure 30E through a connection structure 32C, and connected to the second AF cell of the anti-fuse structure 30F through a connection structure 32D.

The programming line 31B is connected to the second AF cell of the anti-fuse structure 30A and the first AF cell of the anti-fuse structure 30B through a connection structure 32E, connected to the second AF cell of the anti-fuse structure 30C and the first AF cell of the anti-fuse structure 30D through a connection structure 32F, and connected to the second AF cell of the anti-fuse structure 30E and the first AF cell of the anti-fuse structure 30F through a connection structure 32G.

The programming line 31C is connected to the fourth AF cell of the anti-fuse structure 30A and the third AF cell of the anti-fuse structure 30B through a connection structure 32H, connected to the fourth AF cell of the anti-fuse structure 30C and the third AF cell of the anti-fuse structure 30D through a connection structure 32I, and connected to the fourth AF cell of the anti-fuse structure 30E and the third AF cell of the anti-fuse structure 30F through a connection structure 32J.

The programming line 31D is connected to the third AF cell of the anti-fuse structure 30A through a connection structure 32K, connected to the fourth AF cell of the anti-fuse structure 30B and the third AF cell of the anti-fuse structure 30C through a connection structure 32L, connected to the fourth AF cell of the anti-fuse structure 30D and the third AF cell of the anti-fuse structure 30E through a connection structure 32M, and connected to the fourth AF cell of the anti-fuse structure 30F through a connection structure 32N.

In the embodiments, the memory further includes a plurality of BLs arranged in the second direction and extending in the first direction, and a column of anti-fuse structures arranged in the first direction shares the same BL. The BL is connected to the anti-fuse structure through a bit line connection structure BLC.

Specifically, as shown in FIG. 3, the memory includes a plurality of bit lines BL1, BL2, BL3, BL4, BL5 and BL6 arranged in the second direction (e.g., X direction in the figure) and extending in the first direction (e.g., Y direction in the figure). The anti-fuse structures in the same column share the same BL. For example, the anti-fuse structures 30A and 30G arranged in the first direction form a column, and then the anti-fuse structures 30A and 30G share the same BL1. The BL1 is electrically connected to the anti-fuse structures 30A and 30G through the bit line connection structure BLC. In FIG. 3, in order to clearly show the structure of the memory provided by the embodiments of the disclosure, the BL is drawn by dotted lines. It is to be understood that the BL and the anti-fuse structure may be located in different structural layers, and the BL and the programming line may also be located in different structural layers. When the design number of the AF cells in the memory provided by the embodiments of the disclosure is the same, the anti-fuse array only needs to occupy about half of the area, thus meeting the miniaturization requirement.

It is to be understood by those skilled in the art that the terms "unit", "module" or "component" used in the disclosure may be implemented as hardware circuits or other hardware parts in practical applications. For example, the first unit of the present disclosure may be implemented as a first circuit, and the second unit may be implemented as a second circuit.

Those mentioned above are only preferred embodiments of the disclosure. It is to be pointed out that those of ordinary skill in the art may further make a plurality of improvements and modifications without departing from the principle of the disclosure, and these improvements and modifications shall also fall within the scope of protection of the disclosure.

What is claimed is:

1. An anti-fuse structure, comprising:
 a first circuit comprising a first selection transistor, a first anti-fuse cell and a second anti-fuse cell, and
 a second circuit comprising a second selection transistor, a third anti-fuse cell and a fourth anti-fuse cell,
 wherein the first circuit and the second circuit share an active region, the active region is provided with a first extension part and a second extension part which are independent of each other at a first side, and the active region is provided with a third extension part and a fourth extension part which are independent of each other at a second side, the first side being opposite to the second side, wherein the first anti-fuse cell is arranged at the first extension part, the second anti-fuse cell is arranged at the second extension part, the third anti-fuse cell is arranged at the third extension part, and the fourth anti-fuse cell is arranged at the fourth extension part.

2. The anti-fuse structure of claim 1, further comprising:
 a first gate structure arranged on a surface of the active region;
 a second gate structure arranged on the surface of the active region and spaced from the first gate structure;
 a third gate structure arranged on a surface of the first extension part;
 a fourth gate structure arranged on a surface of the second extension part;
 a fifth gate structure arranged on a surface of the third extension part;
 a sixth gate structure arranged on a surface of the fourth extension part;
 a first doped region arranged in the active region between the first gate structure and the second gate structure;
 a second doped region arranged in the active region on a side, away from the second gate structure, of the first gate structure and in the first extension part and the second extension part; and
 a third doped region arranged in the active region on a side, away from the first gate structure, of the second gate structure and in the third extension part and the fourth extension part,
 wherein the first gate structure, the first doped region and the second doped region form the first selection transistor; the third gate structure and the second doped region in the first extension part form the first anti-fuse cell; the fourth gate structure and the second doped region in the second extension part form the second anti-fuse cell; the second gate structure, the first doped region and the third doped region form the second selection transistor; the fifth gate structure and the third doped region in the third extension part form the third anti-fuse cell; and the sixth gate structure and the third doped region in the fourth extension part form the fourth anti-fuse cell.

3. The anti-fuse structure of claim 2, wherein the first side and the second side are opposite in a first direction, and the first gate structure and the second gate structure are arranged in the first direction.

4. The anti-fuse structure of claim 3, wherein the third gate structure and the fourth gate structure are arranged in a second direction, the second direction being perpendicular to or having an acute angle with the first direction.

5. The anti-fuse structure of claim 3, wherein the fifth gate structure and the sixth gate structure are arranged in the second direction, the second direction being perpendicular to or having an acute angle with the first direction.

6. The anti-fuse structure of claim 2, further comprising:
 a bit line connection structure connected to the first doped region between the first gate structure and the second gate structure, wherein the first doped region is configured to be connected to a bit line through the bit line connection structure.

7. The anti-fuse structure of claim 2, further comprising:
 a first connection structure connected to the third gate structure, wherein the third gate structure is configured to be connected to a programming line through the first connection structure, the first connection structure being arranged on a side, away from the second extension part, of the first extension part; and
 a second connection structure connected to the fourth gate structure, wherein the fourth gate structure is configured to be connected to another programming line through the second connection structure, the second connection structure being arranged on a side, away from the first extension part, of the second extension part.

8. The anti-fuse structure of claim 7, wherein the third gate structure comprises a third main region corresponding to the first extension part and a third sub-region protruding away from the second extension part, and the first connection structure is connected to the third sub-region, and wherein the fourth gate structure comprises a fourth main region corresponding to the second extension part and a fourth sub-region protruding away from the first extension part, and the second connection structure is connected to the fourth sub-region.

9. The anti-fuse structure of claim 2, further comprising:
 a third connection structure connected to the fifth gate structure, wherein the fifth gate structure is configured to be connected to a programming line through the third connection structure, the third connection structure being arranged on a side, away from the fourth extension part, of the third extension part; and a fourth connection structure connected to the sixth gate structure, wherein the sixth gate structure is configured to be connected to another programming line through the fourth connection structure, the fourth connection structure being arranged on a side, away from the third extension part, of the fourth extension part.

10. The anti-fuse structure of claim 9, wherein the fifth gate structure comprises a fifth main region corresponding to the third extension part and a fifth sub-region protruding in a direction away from the fourth extension part, and the third connection structure is connected to the fifth sub-region, and wherein the sixth gate structure comprises a sixth main region corresponding to the fourth extension part and a sixth sub-region protruding in a direction away from the third extension part, and the fourth connection structure is connected to the sixth sub-region.

11. The anti-fuse structure of claim 1, wherein the first selection transistor and the second selection transistor are symmetrically arranged with a first axis as a symmetry axis, the first anti-fuse cell and the third anti-fuse cell are symmetrically arranged with the first axis as the symmetry axis, and the second anti-fuse cell and the fourth anti-fuse cell are symmetrically arranged with the first axis as the symmetry axis.

12. An anti-fuse array, comprising a plurality of anti-fuse structures of claim 1, wherein the plurality of anti-fuse structures are arranged in a first direction and a second direction, the first direction being perpendicular to or having an acute angle with the second direction.

13. The anti-fuse array of claim 12, wherein in the second direction, adjacent anti-fuse cells of adjacent anti-fuse structures share the same gate structure.

14. The anti-fuse array of claim 12, wherein first selection transistors of the anti-fuse structures arranged in the second direction share the same gate structure, and the second selection transistors share the same gate structure.

15. A memory, comprising the anti-fuse array of claim 12.

16. The memory of claim 15, further comprising a plurality of programming lines arranged in the first direction and extending in the second direction, and a row of anti-fuse structures arranged in the second direction corresponds to four programming lines, the four programming lines being respectively connected to first anti-fuse cells, second anti-fuse cells, third anti-fuse cells and fourth anti-fuse cells of the anti-fuse structures.

17. The memory of claim 15, further comprising a plurality of bit lines arranged in the second direction and extending in the first direction, wherein a column of anti-fuse structures arranged in the first direction shares the same bit line.

\* \* \* \* \*